United States Patent
Odagiri

(10) Patent No.: US 7,310,055 B2
(45) Date of Patent: Dec. 18, 2007

(54) DATA COMPRESSION METHOD AND COMPRESSED DATA TRANSMITTING METHOD

(75) Inventor: Junichi Odagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/343,290

(22) Filed: Jan. 31, 2006

(65) Prior Publication Data

US 2007/0096953 A1    May 3, 2007

(30) Foreign Application Priority Data

Oct. 31, 2005    (JP) ............... 2005-317343

(51) Int. Cl.
*H03M 7/30* (2006.01)
(52) U.S. Cl. ............. 341/51; 341/106; 707/100; 707/101
(58) Field of Classification Search ............... 341/51, 341/87, 106; 707/100, 101
See application file for complete search history.

(56) References Cited

U.S. PATENT DOCUMENTS 5,254,990 A * 10/1993 Yoshida et al. ............ 341/51
5,274,805 A * 12/1993 Ferguson et al. ............ 707/7
6,320,522 B1    11/2001 Satoh ..................... 341/51
6,529,912 B2 *  3/2003 Satoh et al. ................ 707/101

FOREIGN PATENT DOCUMENTS

| JP | 05054077 A | * | 3/1993 |
| JP | 5-241777 | | 9/1993 |
| JP | 2-3541930 | | 7/2004 |

* cited by examiner

*Primary Examiner*—Howard L. Williams
(74) *Attorney, Agent, or Firm*—Staas & Halsey LLP

(57) ABSTRACT

Character strings in sample data are classified into groups of character strings with the same leading n characters (for example, "abc"). Then, one character string with the highest appearance frequency (the most frequently appearing character string) in the sample data is extracted from each group. The most frequently appearing character strings extracted from each group are registered in a dictionary as initial values in descending order of appearance frequency. Alternatively, character strings in sample data are classified into groups of character strings with the same hash value of leading n characters, the most frequently appearing character string is detected from each of the groups and the most frequently appearing character string is registered in the dictionary as an initial value.

19 Claims, 22 Drawing Sheets

CHARACTER STRING AS AN INITIAL VALUE

| aaa | abc | ac | bb | cc | d |

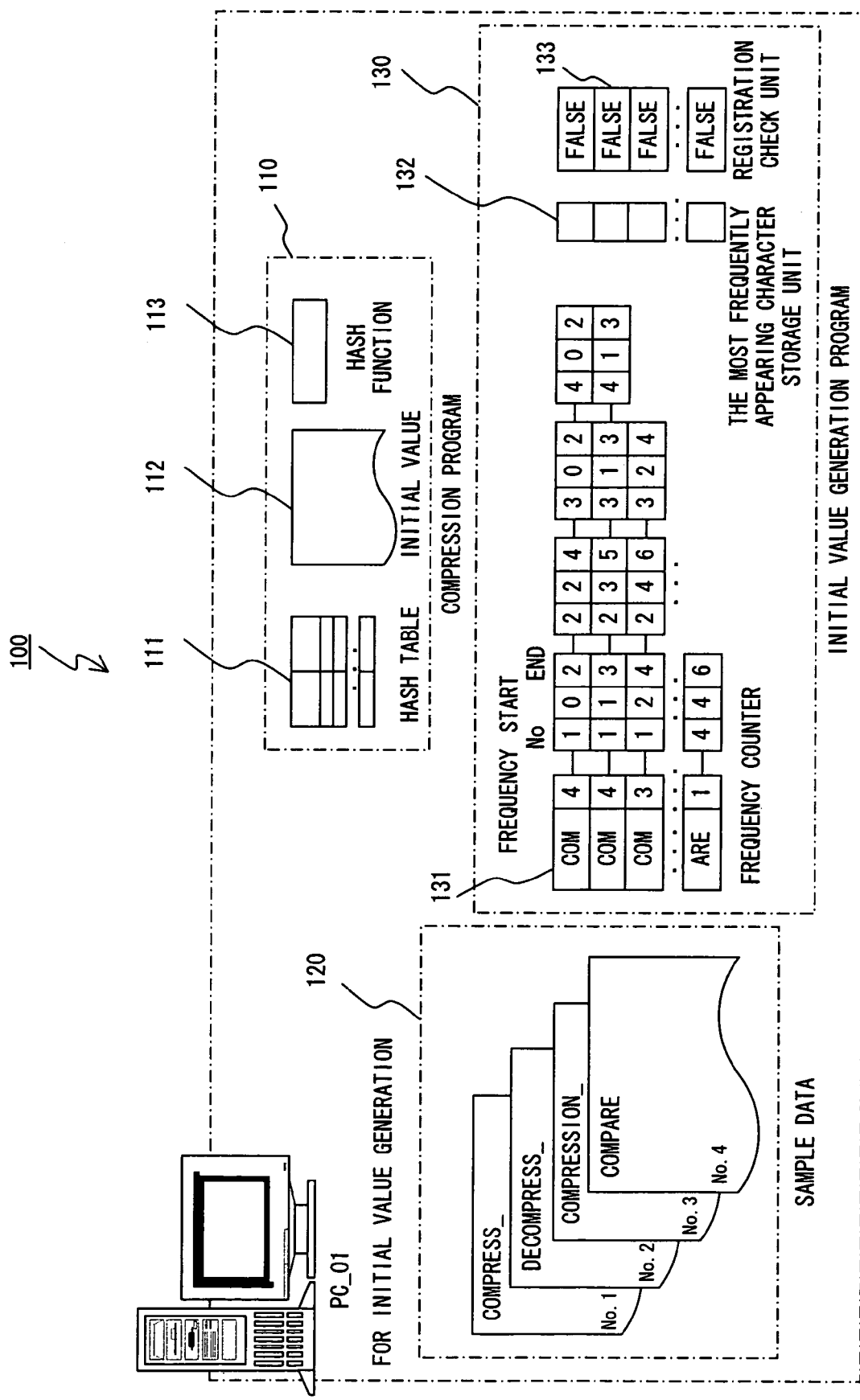
F I G. 8

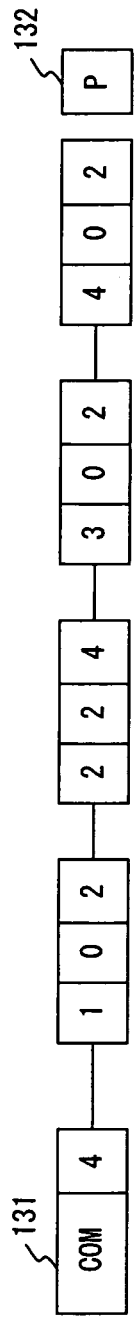
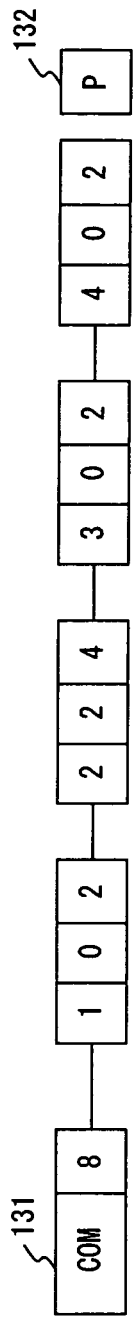
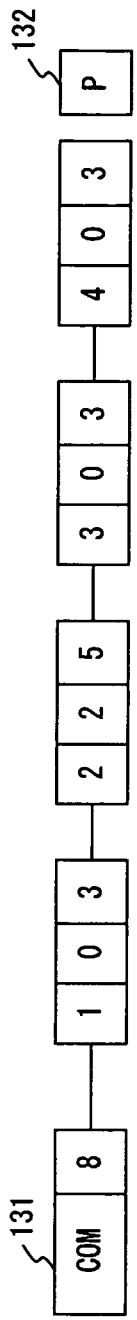
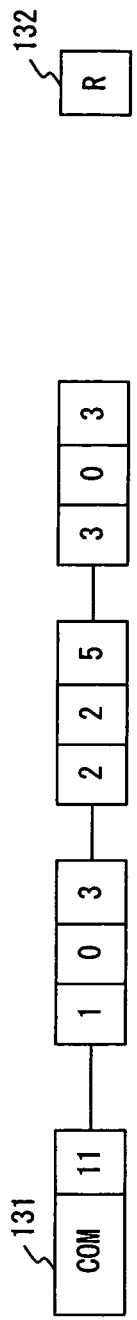
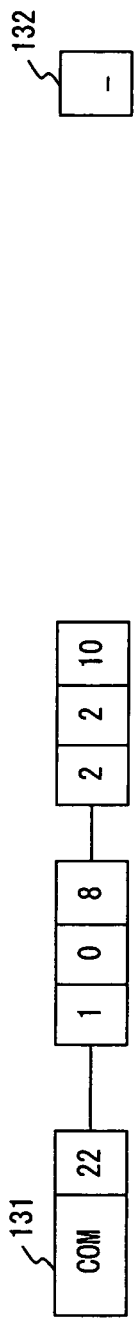

DATA COMPRESSION METHOD AND COMPRESSED DATA TRANSMITTING METHOD

BACKGROUND OF THE INVENTION

1. Field of the Invention

The present invention relates to a data compression method utilizing a slide dictionary, and more particularly to a data compression method suited to compress a text document, a program and the like and a compressed data transmitting method using it.

2. Description of the Related Art

A data compression method includes a lossless method and a lossy method. The lossless method is a reversible compression method capable of completely restoring data and is used to compress mainly a text document, a program and the like. The lossy method is an un-reversible compression method and is used to compress an image, voice and a moving image. Data compression is used in order to reduce the amount of data to be transmitted in data communication.

As one of the lossless compression methods, a data compression method using a slide dictionary is known. This data compression method searches for the longest matching partial string from a data series that previously appeared and outputs the location of the partial string and a matched length as codes. The data series previously appeared are stored in a dictionary. Since the detection range of this dictionary slides during compression, the dictionary is generally called a slide dictionary.

The recent spread of mobile terminals is remarkable. In the service of a mobile terminal, a small capacity of communication is frequently conducted. For example, the amount of data of an HTTP request from a mobile terminal to a server (upward data) is approximately only 1 kilobyte (KB). In data exchange between a mobile terminal and a server and wireless communication by an RFID tag or the like, there is a strong tendency that data with similar contents, such as header information or the like, are frequently repeated in a series of data exchange.

In the conventional data compression method utilizing a slide dictionary, partial strings that previously appeared are registered in a dictionary (is learned by a dictionary) Generally, in order to complete a dictionary, approximately 8 KB of data must be read. In this case, if the amount of data is small, registration (learning) sufficient to compress cannot be made. Therefore, a sufficient compression ratio cannot be obtained.

In order to solve this problem, this applicant has proposed a data compression method for improving a compression ratio by registering in advance frequently appearing characters in a dictionary as an initial value prior compression and matching data to be compressed with the initial value in the dictionary (Japanese Patent Application No. H5-241777). According to this data compression method, the compression ratio of a character string registered in a dictionary as an initial value can be improved since it can be compressed even when it first appears.

FIGS. 1A, 1B and 1C explain the method for registering an initial value in a dictionary which is disclosed by the Japanese Patent Application No. H5-241777.

FIG. 1A shows the types of character strings existing in sample data for generating an initial value, using a tree structure. The characters, "a", "b", "c" and "d" of each node in the tree structure shown in FIG. 1A indicate the character in the sample data, and the figure in a rectangle under it indicates the appearance frequency of the character in each character string.

When character strings whose appearance frequency is equal to or more than a prescribed threshold 2 are extracted refer to the tree structure of FIG. 1A, five character strings of "aaa", "abc", "bb", "cc" and "d" are obtained as in FIG. 1B. And these five character strings are registered in the dictionary 1000 as initial values (see FIG. 1C).

In this way, by registering in advance character strings with high appearance frequency in a dictionary, based on sample data, a data compression ratio can be improved.

This applicant has also proposed the super lossless data compression (SLC) method shown in FIG. 2 (Japanese Patent No. 3541930 and U.S. Pat. No. 6,320,522 B1).

In the SLC method, a hash table is used as a dictionary 2001. And an arbitrary number of characters (three characters in this case) at the top of an already appeared character string in data to be compressed 2000 is converted into a hash value by a hash function 2002 and the hash value and the length of the already appearing character string (character string length) are registered in the dictionary 2001. A serial number starting from 1 is assigned to the character string of the data to be compressed 2000 at the top as an appearance position. A character string that repeatedly appears by sliding a sliding window 2005 is checked, and a character string that coincides with an already appeared character string is encoded into a code (appearance position, length). In this case, the appearance position is an appearance position of the already appeared character string that is registered in the dictionary 2001 and is read from the dictionary 2001 using a hash value as a key.

In FIG. 2 shows an example where data to be compressed 2000 is "compression&decompression . . . " and a character string "compression" that appears twice in this character string is encoded into a code (1, 11). The hash value of the leading three characters "com" of "compression" is i and an appearance position (=1) corresponding to the hash value i is read from the dictionary 2001.

The prior art shown in FIGS. 1A-1C improves data compression efficiency by registering a character string that frequently appears as an initial value before compressing data. However, since an appearing character string (short sentence) whose appearance frequency is equal to or more than a prescribed threshold is registered in a dictionary without processing it, the size of the initial value becomes large.

The prior art shown in FIG. 2 converts an arbitrary number of the leading characters of an already appeared character string that is registered into a hash value in order to detect it in a dictionary and registers the hash value together with the appearance position of the already appeared character string in the dictionary. However, in the dictionary (hash table), one hash value can register only one piece of appearance position information. An initial value character string also includes different character strings whose hash values happen to be the same. If there is such hash value collision, an initial value registered in a dictionary is overwritten by an initial value with the same hash value that appeared after it and the initial value previously registered is not used.

SUMMARY OF THE INVENTION

It is an object of the present invention to generate an initial value with high compression efficiency for slide type dictionary registration. It is another object of the present invention to be able to extract an initial value such that causes no hash value collision when registering the initial value in a hash table used as a slide type dictionary. It is further another object of the present invention to provide a compressed data transmitting method using a dictionary in which such initial values are registered in advance.

The data compression method of the present invention presumes one for generating an initial value from sample data, registering in advance the initial value in a dictionary and encoding data using the dictionary.

The first aspect of the data compression method of the present invention classifies character strings in sample data into groups with the same leading n characters (n=natural figure), detects a most frequently appearing character string from each of the groups and registers the most frequently appearing character string in a dictionary as an initial value.

According to the first aspect of the data compression method of the present invention, a highly frequently appearing and longer character string can be registered in a dictionary as an initial value by preparing appropriate sample data. Thus, an initial value with high compression efficiency can be registered with a limited initial value size.

The second aspect of the data compression method of the present invention classifies character strings in sample data into groups with the same hash value of leading n characters (n=natural figure), detecting a most frequently appearing character string from each of the groups and registering the most frequently appearing character string in a dictionary as an initial value.

According to the second aspect of the data compression method of the present invention, an initial value registered in advance can be prevented from being deleted by an initial value registered after it when registering an initial value in the type of dictionary using a hash table to detect character string position information in it or the like.

In the first or second aspect of data compression method of the present invention, for example, when detecting the most frequently appearing character string, the appearance frequency of each character subsequent to the leading n characters is calculated and the most frequently appearing character string is determined based on those appearance frequencies. In this determination, a character string with the largest sum of the appearance frequencies of each character subsequent to the leading n characters is determined as the most frequently appearing character string.

In the compressed data transmitting method of the present invention, a server has dictionary information generated by the first or second aspect of data compression method, transmits the dictionary information to a client and transmits/receives data to/from the client after compressing the data by the dictionary information.

The dictionary information is an initial value registered in a dictionary or the initial value and its position information in the dictionary, such as a hash table or the like.

In the compressed data transmitting method of the present invention, for example, the server can also have a plurality of pieces of dictionary information generated by the first or second aspect of data compression method of the present invention and compress data, using dictionary information with the best compression efficiency of the data when transmitting the data to the client.

According to the compressed data transmitting method of the present invention, a fairly small capacity of data can be transmitted/received between a server and a client.

BRIEF DESCRIPTION OF THE DRAWINGS

FIG. 8 shows the system configuration of an information processing device for generating an initial value in the first preferred embodiment of the present invention.

FIG. 14 FIG. 13 explains the process of the flowchart shown in FIG. 12 (No.2).

FIGS. 15A-15E explain the process of the flowchart shown in FIG. 12 (No.3).

DETAILED DESCRIPTION OF THE PREFERRED EMBODIMENTS

The preferred embodiments of the present invention are described with reference to the drawings below.

[Principle of the Invention (No.1)]

Figures 1A, 1B, 1C:
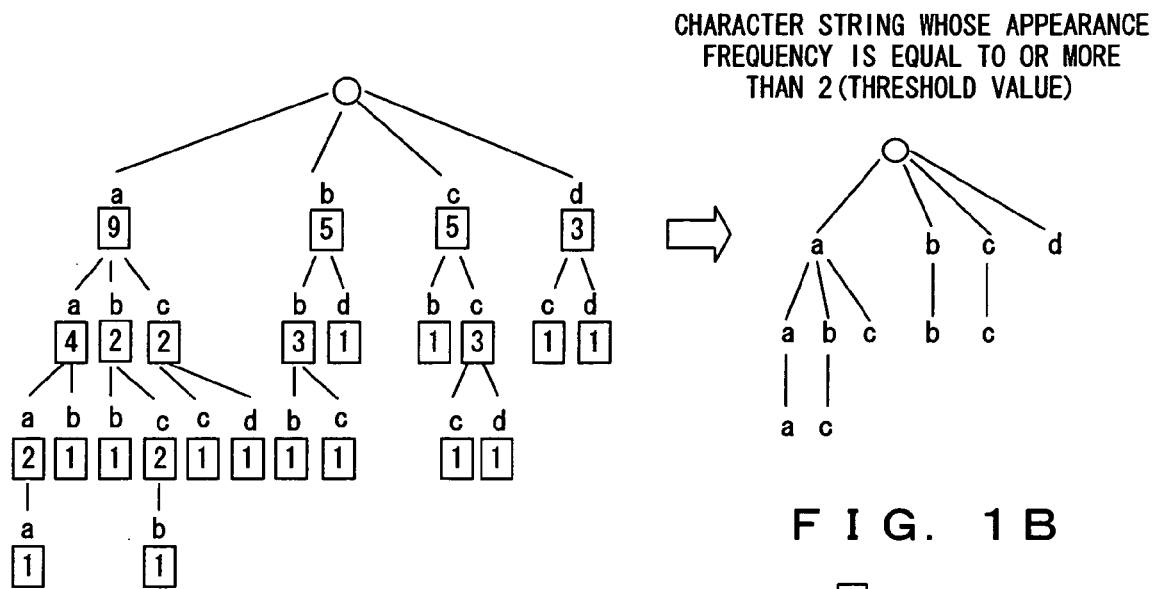
FIGS. 1A, 1B and 1C explain the conventional dictionary generation method.
Figure 2:
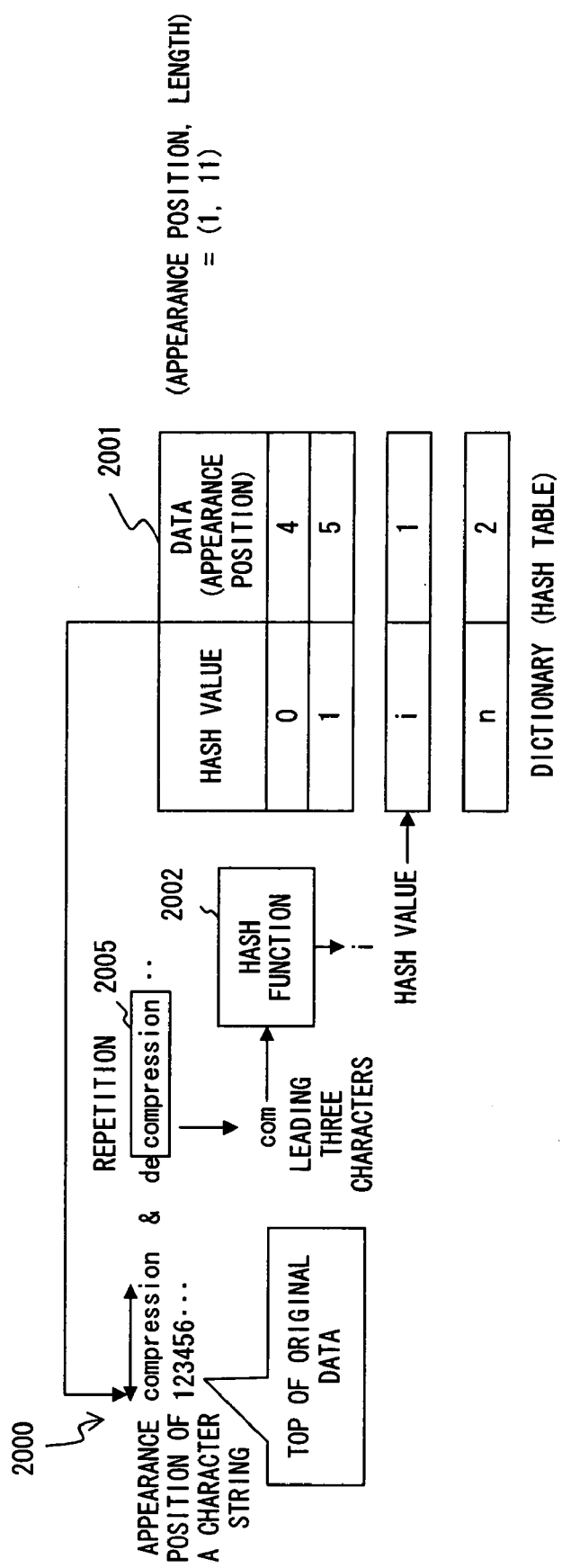
FIG. 2 explains a data compression method using a slide dictionary.
Figure 3:
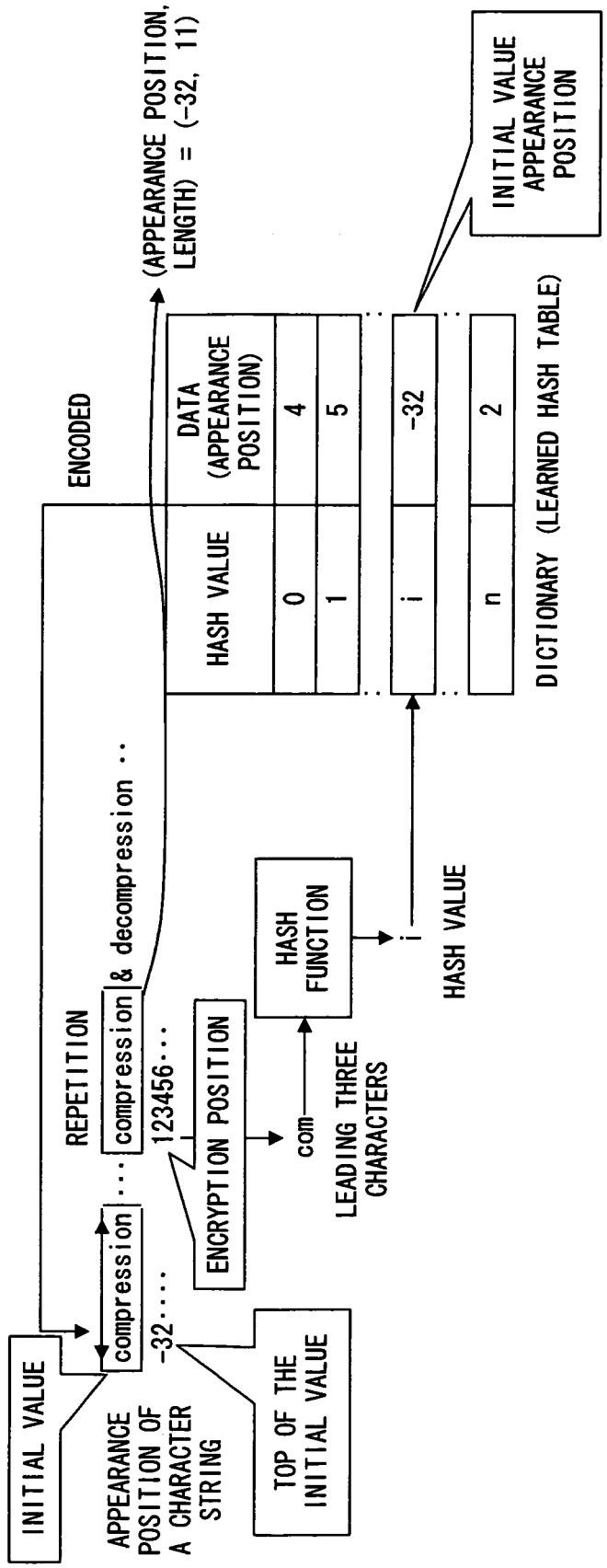
FIG. 3 explains how to encode data to be compressed in the present invention.

FIG. 3 explains how to encode data to be compressed in the present invention.

In the present invention, a long character string that is frequently appears in sample data is prepared as an initial value in advance. Then, regarding the initial value virtually appears before a character string to be compressed (data to be compressed), the data is compressed and decompressed referring to the initial value.

In this specification, sometimes a slide dictionary is simply described as a dictionary, for convenience' sake.

In FIG. 3, it is regarded that a character string (initial value) "compression" virtually appears before a character string to be compressed "compression&decompression . . . ". The leading position of the data to be compressed is set to "1". In FIG. 3, an already learned hash table 14 is shown.

In the hash table 14, as in the earlier described SLC method, the appearance position of the leading n character (leading three characters in FIG. 3) of an initial value is registered. Although in the hash table 14 of FIG. 3, a hash value is related to data for convenience' sake, in an actual hash table there is no need to register a hash value since the hash value has data indicating a line to access in the hash table.

In FIG. 3, the first initial value is "compression". Since the hash value of the leading three characters "com" of "compression" is "i", the starting position of "compression" is registered in the "i+1"-th line of the hash table 14. In this registration, the appearance position (position of a leading character) of "compression", "−32" is registered in the "i+1"-th line of the hash table 14.

In FIG. 3, the leading 11 characters of the character string to be compressed, "compression&decompression . . . " is the same as that of the initial value "compression". Therefore, as to the character string to be compressed, the first 11 characters "compression" is immediately encoded into a code (−32, 11).

In this way, since compression using a slide dictionary can encode a long repetition into one code, there is a high possibility that data to be compressed may be encoded with a high compression ratio, by registering a character string with a high appearance frequency (frequently appearing character string) in a slide dictionary in advance.

A slide dictionary using a hash table comprises memory for registering a new character string that appears when encoding an initial value and data to be compressed (hereinafter called a "dictionary buffer" for convenience' sake) and a hash table for storing the starting position of a character string registered in the memory. The learning of a slide dictionary using a hash table is performed by two processes of registering a character string in a dictionary buffer and registering the starting position of the character string registered in the dictionary buffer, in a hash table.

Figure 4:
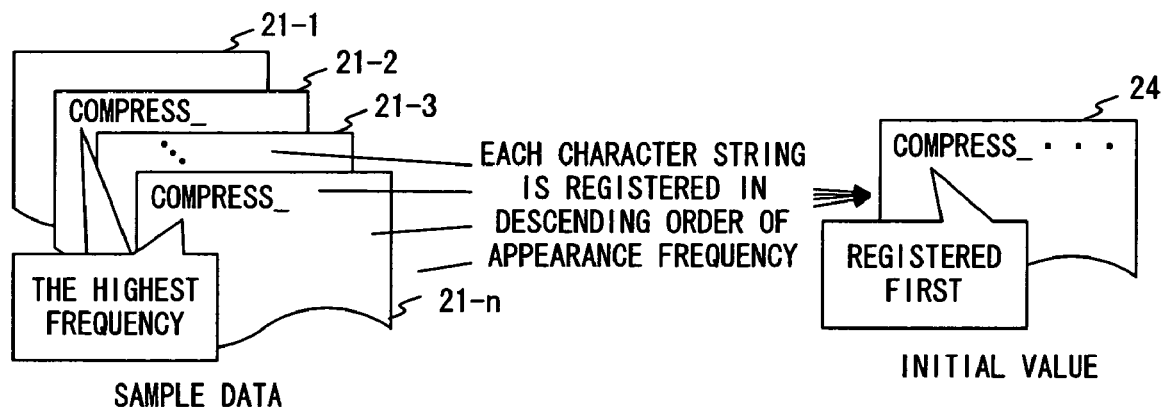
FIG. 4 conceptually shows the initial value generation method of the present invention.

When registering an initial value in a slide dictionary, as typically shown in FIG. 4, a character string with high compression efficiency (frequently appearing long character string) must be generated as an initial value from a plurality of pieces of sample data 21-1~21-n and those character strings must be registered in a dictionary 24 in descending order of appearance frequency.

The slide dictionary usually stores only the appearance position of a leading character string in the hash table. This is because of sparing the used capacity of memory. In the present invention, the hash table of the slide dictionary stores only the appearance position of the leading n characters (n=natural figure) of an initial value in the hash table.

Next, the procedure of the initial value generation/registration method of the present invention is described.

(1) A plurality of pieces of sample data is prepared and character strings that appear in the sample data are classified into groups with the same leading n characters.

(2) The most frequently appearing character string (character string with the most frequently appearance frequency) is detected from each group classified in process (1).

(3) The most frequently appearing character strings of each group, obtained in process (2) are registered as their initial values in a slide dictionary in descending order of frequency.

By the processes (1)-(3), the most frequently appearing character strings of each group with the same leading n characters are arrayed in a line one for each group and descending order of frequency and registered as initial value character strings. If in the processes (1)-(3), a limit is provided for an initial value size in a slide dictionary, the most frequently appearing character strings continue to be registered in the slide dictionary until its upper limit is reached.

In this specification, sometimes a series of one or a plurality of the most frequently appearing character strings to be registered in advance in a slide dictionary before starting compressing data using a slide dictionary is referred to as an "initial value" instead of an "initial value character string". Thus "initial value" might indicate "initial value character string".

Figure 5:
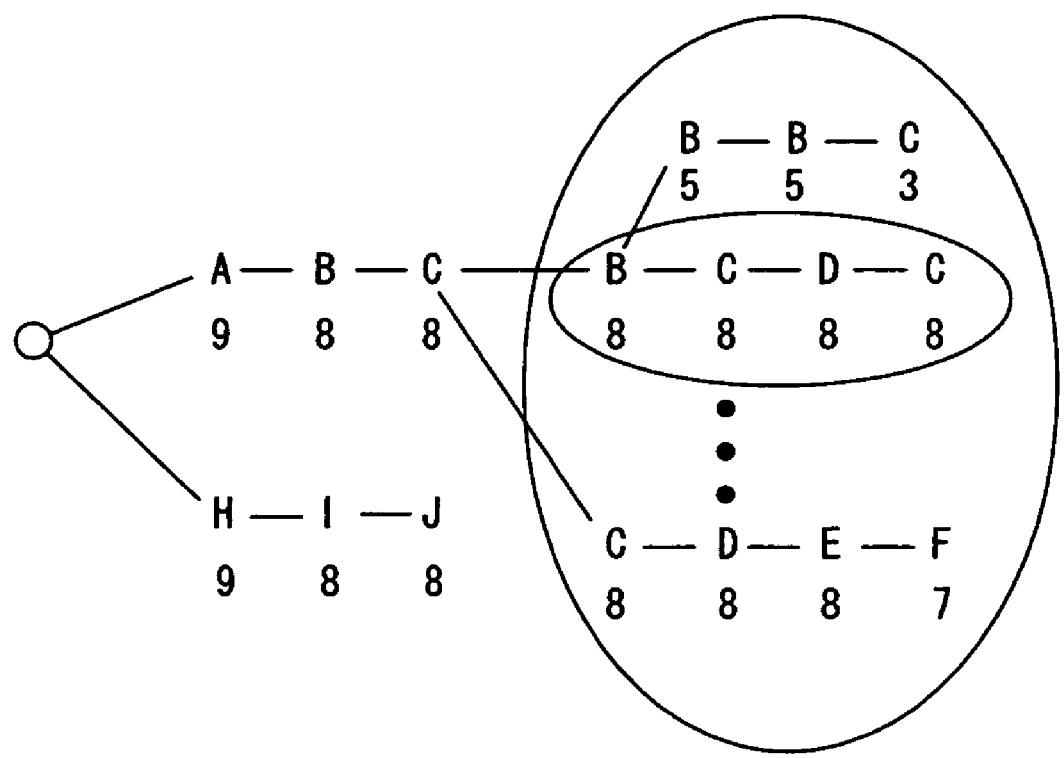
FIG. 5 shows the case where the initial value generation method of the present invention is applied to character strings with the same leading three characters.

FIG. 5 shows the case where the initial value generation method of the present invention is applied to character strings with the same leading three characters.

In FIG. 5, the classification of character strings with the leading three characters "ABC" generated in process (1) is shown by a tree structure. In this example, character strings whose character strings subsequent to the leading three characters "ABC" are "BBBC", "BCDC", . . . and "CDEF" are shown. In this tree structure, figures under the character disposed to each node show the appearance frequency of the character. In this example, a character string whose character string subsequent to "ABC" is "BCDC", that is, a character string "ABCBCDC" appears eight times and most frequently appears. Therefore, character string "ABCBCDC" is detected as the longest most frequently appearing character string of the character string group whose leading three characters are "ABC". Similarly, the longest most frequently appearing character string of character strings whose leading three characters are other than "ABC" can be detected.

In this way, the present invention extracts the longest most frequently appearing character string from character strings starting with the same leading n characters and those extracted most frequently appearing character strings are registered in a dictionary as initial characters in descending order of frequency in advance.

[Principle of the Invention (No.2)]

Figure 6:
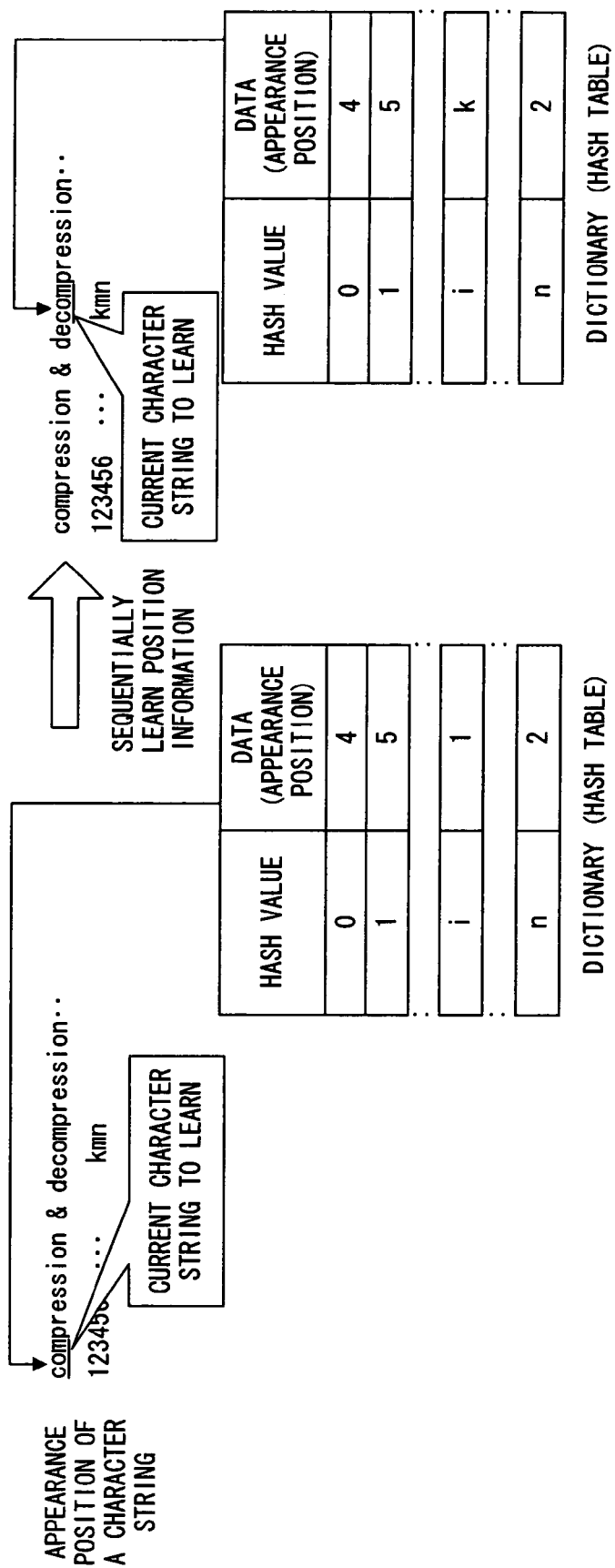
FIG. 6 explains how the position information of an initial value generated when using a hash table for a dictionary is overwritten.

If there is a character string whose position information is already registered in a hash table in subsequent character strings, specifically, a different character string whose hash value happens to be the same in the course of sequentially learning the position information of a hash values when using a hash table as a dictionary, as shown in FIG. 6, the existing position information is over written by the position information of a newly appearing character string. In FIG. 6, the position information of "compression", "1" is overwritten by "k".

For that reason, in the present invention, if a character string corresponding to a specific hash value when registering an initial value in a hash table, the character string corresponding the hash value is prevented from being registered again.

Since in a hash table used in the present invention, a hash value is used as a value indicating a line in the hash table, specifically, in a hash table one piece of position information is registered for one hash value, the most frequently appearing character string must be detected for each hash value.

A hash value is calculated based on leading n characters registered as an initial value. Therefore, in the present invention, the most frequently appearing character string is detected from character strings with the same leading n characters and the most frequently appearing character string is determined as an initial value.

Figure 7:
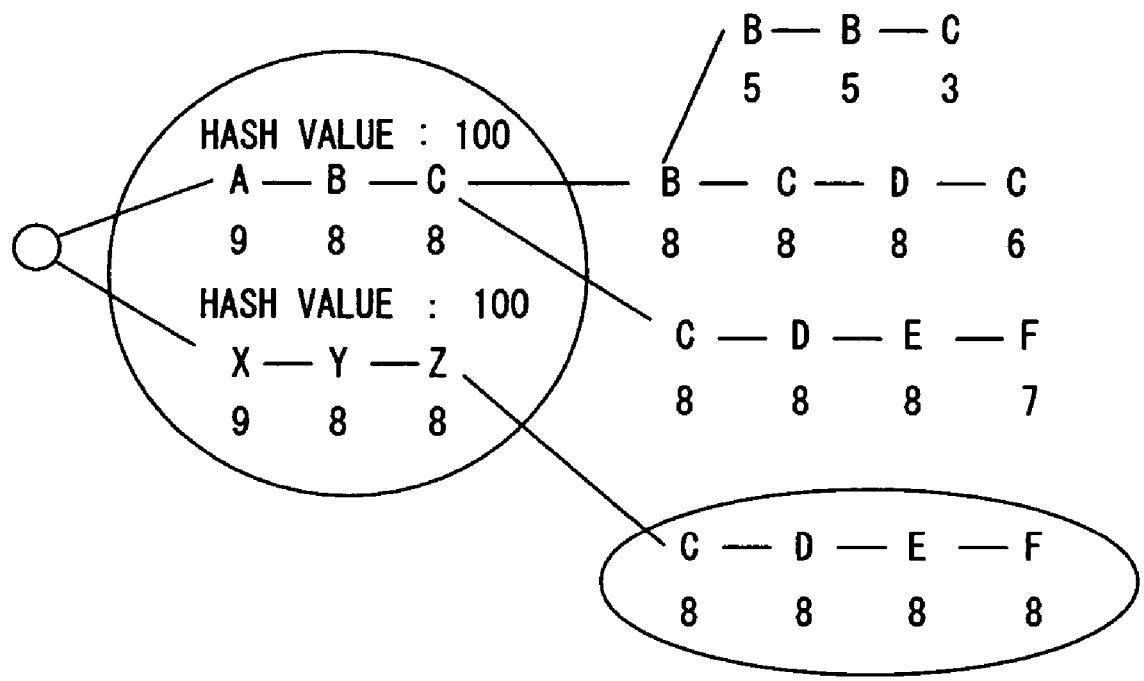
FIG. 7 explains the initial value generation method such that the position information is not overwritten in a hash table.

FIG. 7 explains a method for generating an initial value (the most frequently appearing character string) from character strings with the same leading three characters as described above.

In the tree structure shown in FIG. 7, the hash values of two leading three characters "ABC" and "XYZ" are the same (=100). Therefore, the most frequently appearing character string is detected from character strings with leading three characters "ABC" or "XYZ" and is registered in a hash table as an initial value. In FIG. 7, "XYZCDEF" appears eight times and is the most frequently appearing and the longest character string.

Similarly, the longest most frequently appearing character string of character strings the hash value of whose leading three characters is other than 100 is also detected and is registered in the hash table as an initial value.

By sequentially registering initial values in the hash table in this way, the position information of an initial value registered in the hash table is prevented from being overwritten. This is because only one piece of position information is registered for one hash value in a hash table.

By using the same method, even when registering the leading n characters of an initial value in a hash table, the overwriting of the position information of an initial value can be prevented.

The First Preferred Embodiment

The first preferred embodiment of the present invention is a system comprising an information processing device for initial value generation, an information processing device on the data compression side and an information processing device on the data decompression side.

FIG. 8 shows the system configuration of an information processing device for generating an initial value by the data compression method of the present invention.

The information processing device 100 for initial value generation comprises a compression program 110, sample data 120 and an initial value generation program 130. These are stored in memory or an external storage device (storage) of the information processing device 100.

The compression program 110 is a program to compress/decompress data and comprises a hash table 111, an initial value (initial value character string) 112 and a hash function 113 inside. The hash table 111 is a dictionary which stores the position information in a position inside the table, indicated by the hash value of the leading n characters of a character string registered as an initial value n. The data structure of the hash table 111 is the same as that of the hash table 14 shown in FIG. 3. The initial value 112 is a character string used to compress/decompress data and is generated by an initial value generation program 130. The hash function 113 calculates a hash value corresponding to the leading three character of the initial value 112.

The compression program 110 receives/restores the initial value from the initial value generation program 130. Then, the hash value of the leading n characters of the initial value 112 is calculated by the hash function 113 and the position information of an initial value 112 is registered in the same line as the hash value in the hash table. Alternatively, it registers the position information of the initial value registered in the hash table 111 in a line registering the hash value.

The sample data 120 is composed of four pieces of sample data No.1-No.4. Sample data No.1 (hereinafter called "sample data 1 for convenience' sake) is a character string "COMPRESS_". Sample data No.2 (hereinafter called "sample data 2 for convenience' sake) is a character string "DECOMPRESS_". Sample data No.3 (hereinafter called "sample data 3 for convenience' sake) is "COMPRESSION_". Sample data No.4 (hereinafter called "sample data 4 for convenience' sake) is "COMPARE".

The initial value generation program 130 comprises a frequency counter 131, the most frequently appearing subsequent character storage unit 132 and a registration check unit 133.

The frequency counter 131 classifies all character strings that appear in sample data 1-4 into groups with the same leading three characters and detects the most frequently appearing character string from character strings with the same leading three characters. The frequency counter 131 comprises an area for storing leading three characters and frequency, in which the character strings with the same leading three characters are connected by a pointer. Such elements of the structure are provided for each set of leading three characters. Such a list is composed of a sample data number, and the start and end positions of a character string.

The most frequently appearing subsequent character storage unit 132 stores characters subsequent to the leading three characters when the initial value generation program 130 generates an initial value 112. The most frequently appearing subsequent character storage unit 132 lastly stores the end character of the most frequently appearing character string.

The registration check unit 133 stores status information indicating whether the most frequently appearing character string stored in the list of the frequency counter 131 is registered as an initial value. The status information becomes "TRUE" when it is registered as an initial value, and it becomes "FALSE" when it is not registered. The status information is initially set to "FALSE" before the commencement of the initial value generation process.

Figure 9:
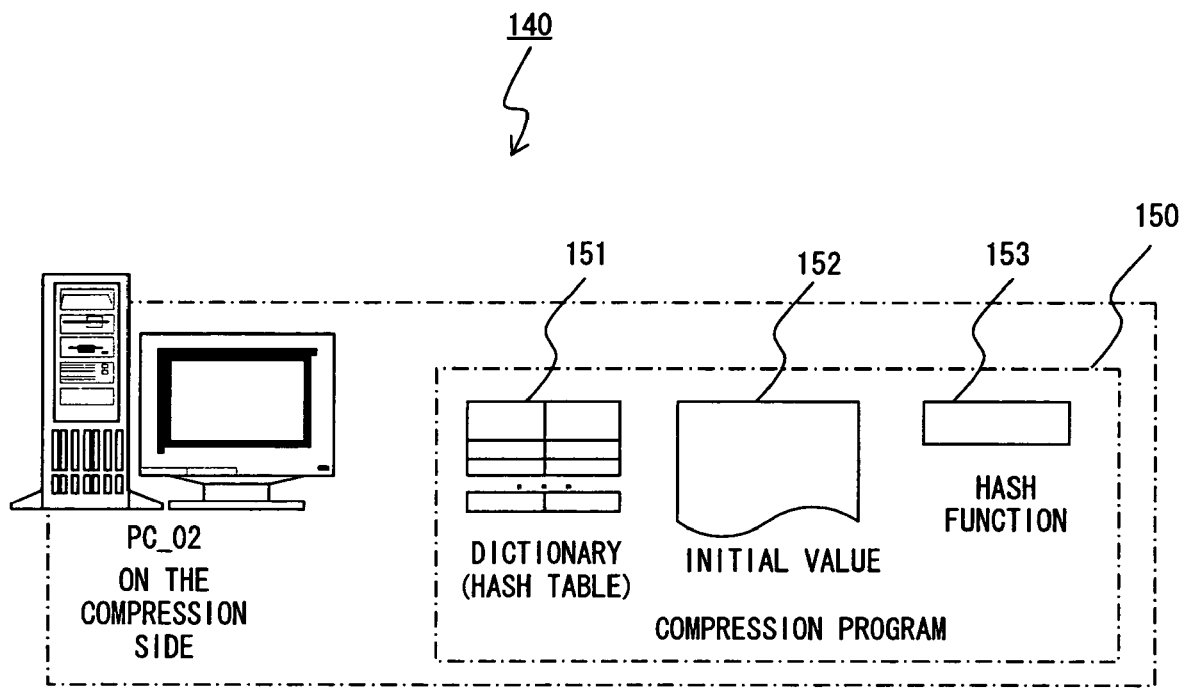
FIG. 9 shows the system configuration of an information processing device on the data compression side of the first preferred embodiment.

FIG. 9 shows the system configuration of an information processing device on the data compression side.

The information processing device 140 on the data compression side stores a compression program 150 in memory, an external storage device or the like. The compression program 150 is a program to compress/decompress data and stores a hash table 151, an initial value (initial value character string) 152 and a hash function 153 inside. Since the dictionary 151, initial value 152 and hash function 153 have the same structure/function as the hash table 111, initial value 112 and hash function 113, respectively, of the compression program 110 of the information processing device 130 shown in FIG. 8, their detailed descriptions are omitted.

Figure 10:
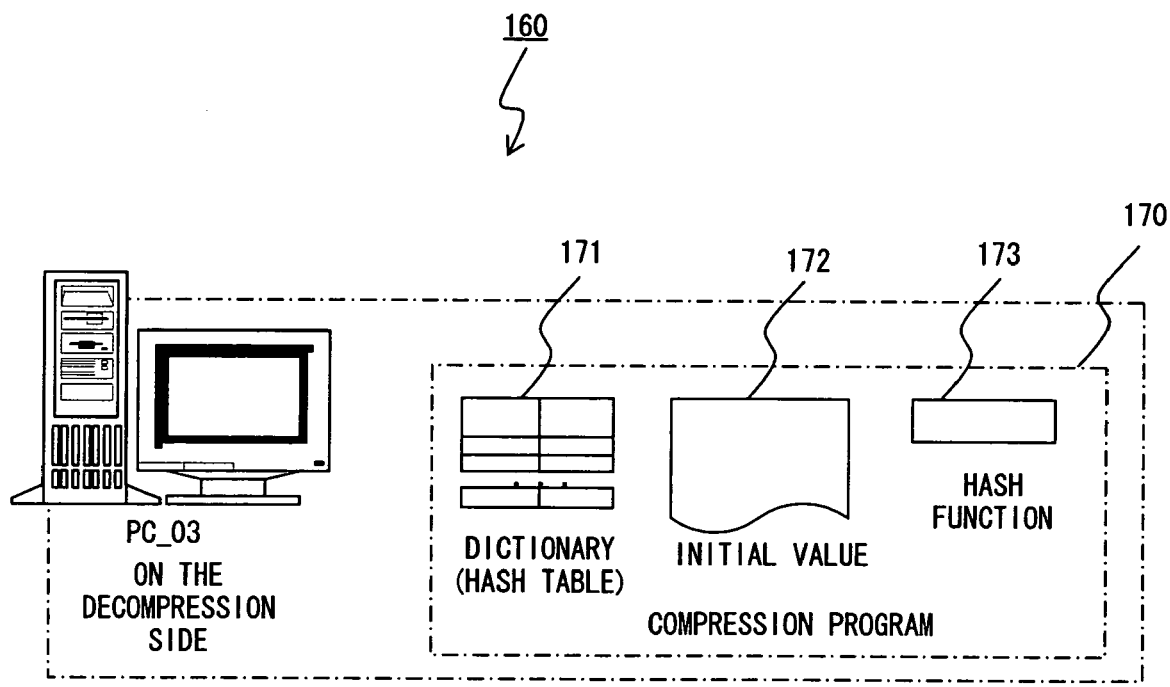
FIG. 10 shows the system configuration of an information processing device on the data decompression side of the first preferred embodiment.

FIG. 10 shows the system configuration of an information processing device on the data decompression side.

The information processing device 160 on the data decomposition side stores a compression program 170 in memory or an external storage device or the like. The compression program 170 is a program to compress/decompress data, and stores a dictionary (hash table) 171, an initial value (initial value character string) 172 and a hash function 173. Since the dictionary 171, initial value 172 and hash function 173 have the same structure/function as the hash table 111, initial value 112 and hash function 113, respectively, of the compression program 110 of the information processing device 130 shown in FIG. 8, their detailed descriptions are omitted.

The three information processing devices 100, 140 and 160 are connected via a network and data can be transmitted/received among them.

The summary of the process of the first preferred embodiment is described below with reference to FIG. 11.

[Pre-process]

Prior to the compression/decompression of data, the generation of an initial value and the learning of a dictionary (hash table) are performed as pre-processes. The learning of a dictionary means to register an initial value and its position information in a dictionary.

After that, the initial value and dictionary are distributed to the information processing device 140 on the compression side and the information processing device 160 on the decompression side via a network. The information processing device 140 and the information processing device 160 store the initial value and dictionary distributed from the information processing device 100 in an external storage device.

Figures 11A, 11B:
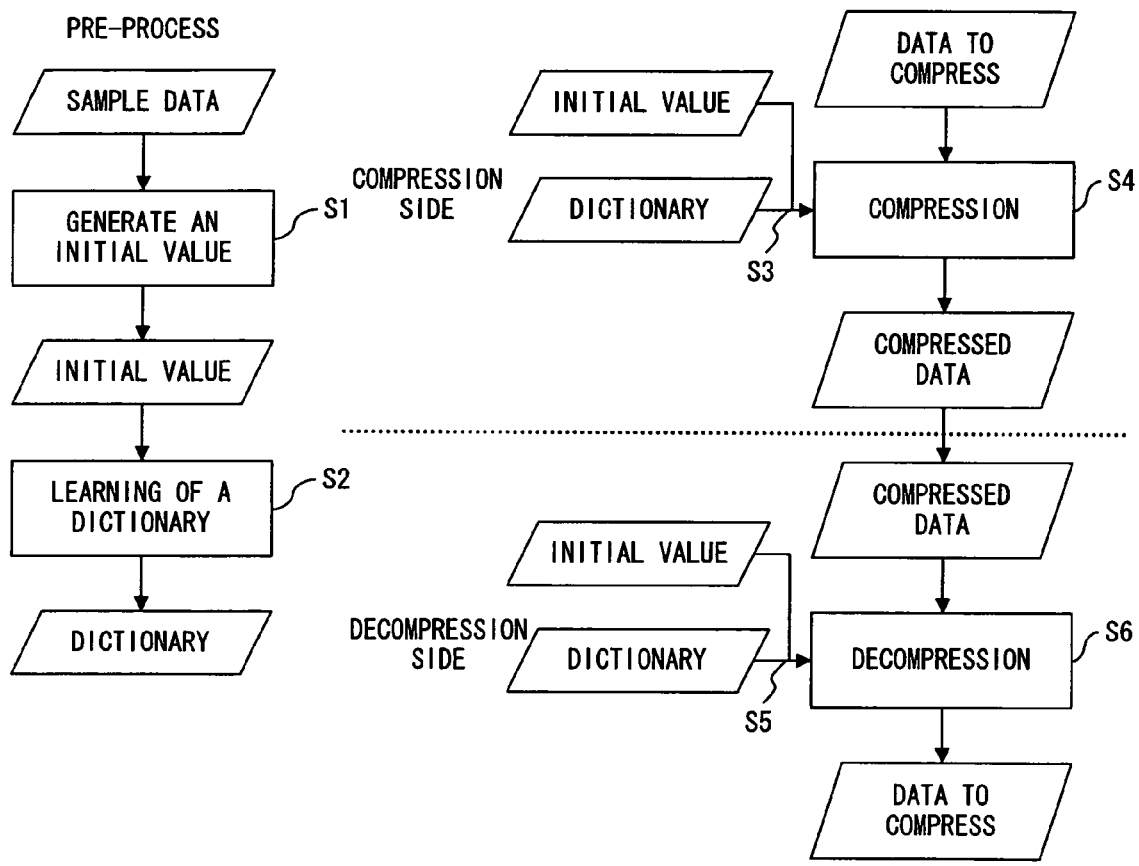
FIGS. 11A and 11B are basic flowcharts showing the entire process of the first preferred embodiment.

The procedure of the pre-process of the information processing device 100 is described below with reference to FIG. 11A.

(1) An initial value is generated from sample data (step S1)
(2) The dictionary learns the position information of the generated initial value and is completed (step S2).

[Compression Process]

The procedure of the data compression process is described below with reference to FIG. 11B. This data compression process is performed by the information processing device 140 executing the compression program 150.

(1) The initial value and dictionary that are stored in the external storage device is load onto memory (step S3).
(2) Compressed data is generated by compressing data to be compressed, based on the initial value and dictionary (step S4).

The information processing device 140 transmits the compressed data to the information processing device.

[Decompression Process]

The decompression process of the compressed data is described below with reference to FIG. 11B. This data decompression process is executed by the information processing device 160 executing a compression program 170.

(1) The initial value and dictionary stored in the external storage device are loaded onto memory (step S5).
(2) The compressed data is decomposed into the original data, based on the initial value and dictionary (step S6).

[Detailed Initial Value Generation Process and Dictionary Generation Process]

Figure 12:
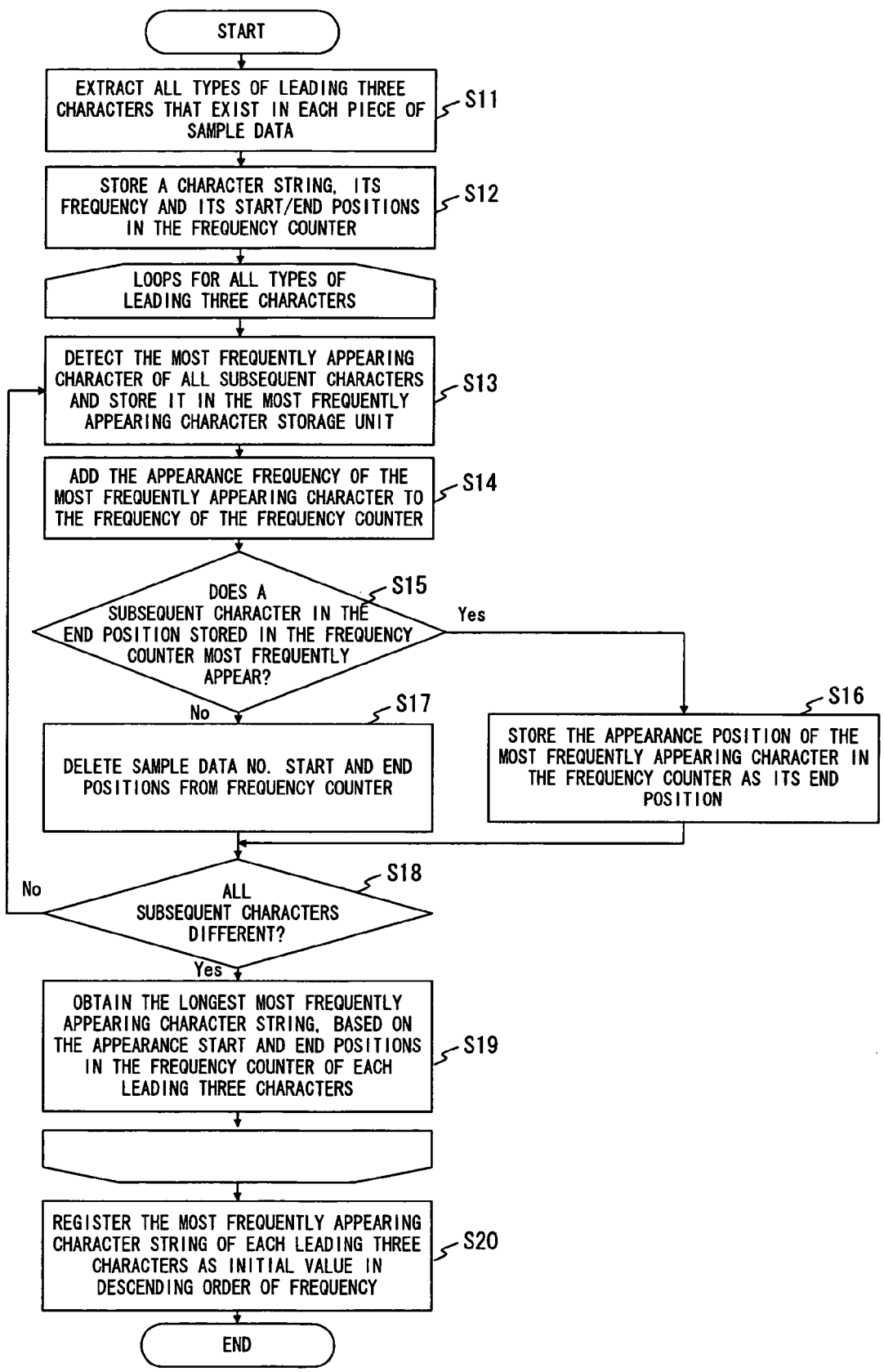
FIG. 12 is a flowchart showing the initial value generation/registration process of the first preferred embodiment.

FIG. 12 is a flowchart showing the detailed initial value generation process and dictionary generation process (dictionary learning process) by the information processing device 100 executing the initial value generation program 130. FIGS. 13-16 are used to easily understand the processes shown in the flowchart of FIG. 12.

The detailed initial value generation process of the information processing device 100 is described with reference to the FIGS. 12-16. In this example, the process is performed by grouping character strings with the same leading three characters.

The information processing device 100 extracts all character strings composed of three characters existing in sample data 120 (sample data 1-4)(step S11).

Figure 13:
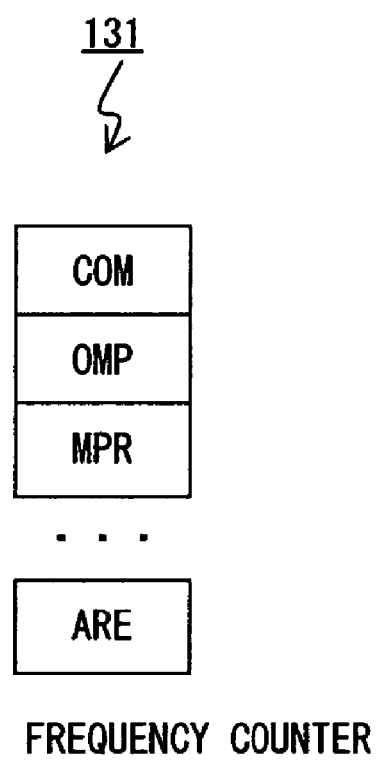
FIG. 13 explains the process of the flowchart shown in FIG. 12 (No.1).

As a result, as shown in FIG. 13, character strings "COM", "OMP", "MPR", . . . and "ARE" are extracted as shown in FIG. 13.

Then, as to the character strings extracted in step S11 (hereinafter called "extracted character strings"), all of a "character string", "frequency", a "start position" and "an end position" are stored in the frequency counter 131 (step S12).

Figure 14:
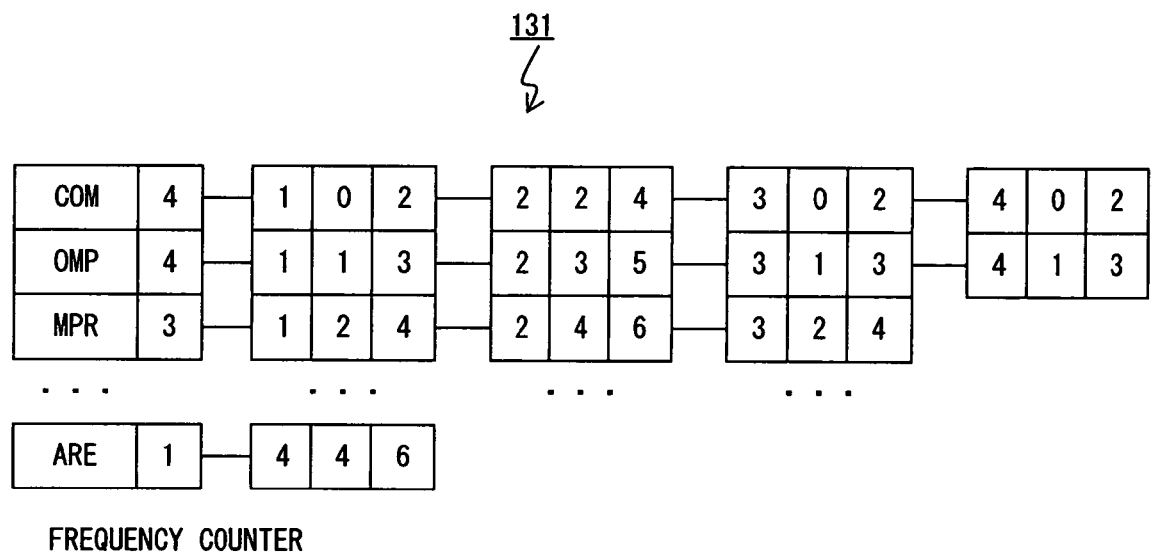

As a result, the contents of the frequency counter 131 as shown in FIG. 14, and "sample No.", "start position" and "end position" are stored in each component of a list connected to "frequency".

The "frequency" of "COM" is 4, and character string "COM" appears in all pieces of sample data 1-4.

Then, the processes in steps S13-S18 are applied to all the extracted character strings while sequential selecting the extracted character strings one by one.

Firstly, "COM" is selected. In step S13, the most frequently appearing character is detected from subsequent characters (character immediately after the end position), and the most frequently appearing character is stored in the most frequently appearing subsequent character storage unit 132.

As a result, in the case of "COM", "P" is stored in the most frequently appearing subsequent character storage unit 132 (see FIG. 5A).

Then, the number of appearance of the most frequently appearing character (number of appearance in the sample data 1-4) detected in step S13 is added to the "frequency" of the frequency counter 131 (step S14).

As a result, since in the case of "com", all the subsequent characters in the sample data 1-4 are "P", 4 is added to the "frequency", and "frequency" becomes 8 (see FIG. 15B).

Then, it is determined whether the character immediately after the "end position" stored in the frequency counter 131 (subsequent character) is the most frequently appearing character (step S15). If it is the most frequently appearing character, the process proceeds to step S16. Otherwise, the process proceeds to step S17.

Instep S16, the appearance position of the character that is determined to be the most frequently appearing character in step S15 is stored (set) in the frequency counter 131 as a new end position.

As a result, in the case of "COM", the "end position" of the four character strings stored in the frequency counter 131 is shifted backward by one character (see FIG. 15C).

In step S17, a component in which the subsequent character is not the most frequently appearing character is deleted from the list of the frequency counter 131. In this process, a character string that is not the most frequently appearing character string candidate is deleted from the list of the frequency counter 131.

If a plurality of character strings with the same leading three characters stored in the frequency counter 131, either process in step S16 or S17 is applied to each character string, according to the determination result in step S15.

After the step S16 or S17, it is determined whether all the subsequent characters of the character strings stored in the frequency counter 131 are different (step S18).

If in step S18 it is determined that all the subsequent characters of the character strings stored in the frequency counter 131 are different, the process proceeds to step S19.

Otherwise, in order to further search for the subsequent most frequently appearing character, the process returns to step S13.

In this way, the processes in step S13-S18 are repeated until in step S18 it is determined that all the subsequent characters of character strings with leading three characters are different.

In the case of "COM", in the determination process in the second step S15 it is determined that only the subsequent character of sample data 4 is "A" and all the subsequent characters of sample data 1-3 are "R" (the most frequently appearing character). As a result, in step S17, a pointer corresponding to the character string "COMPA" of sample data 4 is deleted from the frequency counter 131 and also in step S16, "R" is stored in the most frequently appearing subsequent character storage unit 132 of the frequency counter 131 (see FIG. 15D).

As described above, for "COM", the processes in steps S13-S18 are repeated six times and in step S19 it is determined that there is no subsequent character.

Immediately before proceeding to step S19, the contents of the frequency counter 131 and most frequently appearing subsequent character storage unit 132 of "COM" are as shown in FIG. 15E. Specifically, "_" is stored in the most frequently appearing subsequent character storage unit 132, the start and end positions of the character string "COMPRESS_" in sample data 1 and 2 are stored in the frequency counter 131, and 22 is stored in frequency.

After the processes in steps S13-S19 of "COM" are completed in this way, the same processes as those in steps S13-S19 are applied to subsequent leading three characters "OMP" stored in the frequency counter 131.

In this way, the processes in steps S13-S19 are repeated until a process for the last leading three characters "ARE" stored in the frequency counter 131 is completed.

After the processes in steps S13-S19 of "ARE" are completed, specifically, the processes in steps S13-S19 of all the leading three characters extracted in step are completed, the process proceeds to step S20.

Figure 16:
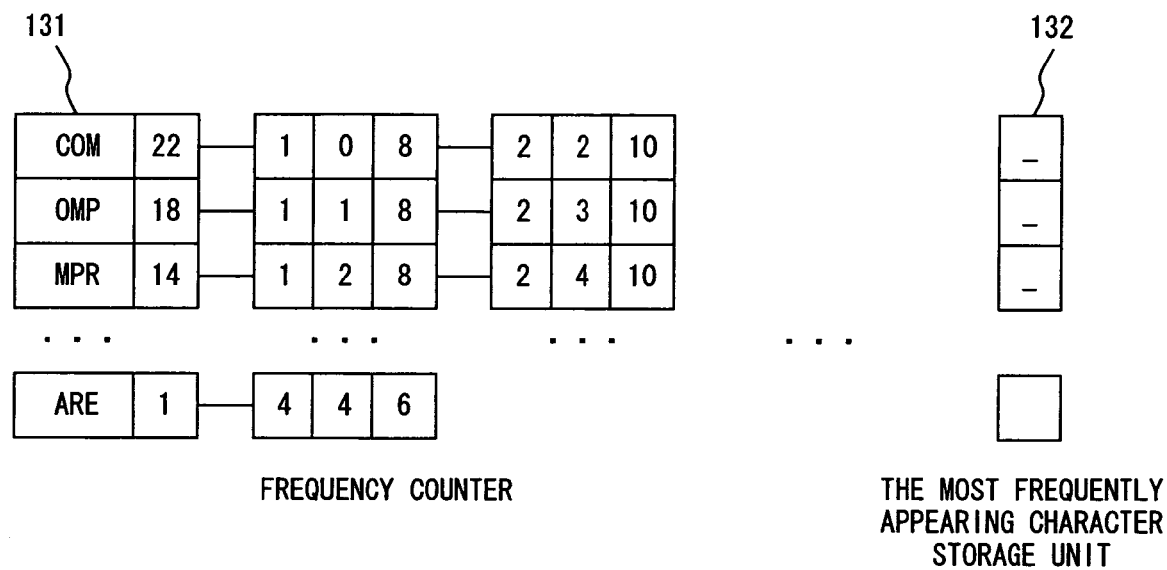
FIG. 16 explains the process of the flowchart shown in FIG. 12 (No.4).

FIG. 16 shows the contents of the frequency counter 131 and most frequently appearing subsequent character storage unit 132 of all the character strings with different leading three characters, extracted in step S11 at the time the processes in steps S13-S19 are completed.

As shown in FIG. 16, the "start position" and "end position" of the most frequently appearing character strings with each set of leading three characters of "COM", "OMP", "MPR", . . . and "ARE" in the sample data 120 are stored in the frequency counter 131. The sum of the number of appearances (appearance frequency) of the most frequently appearing character at each position subsequent to leading three characters in the sample data 120 is stored in the "frequency" of the frequency counter 131.

By referring to a set of a "sample data number", a "start position" and an "end position", stored in the frequency counter 131, "COMPRESS_" that exists in sample data 1 and 2 can be obtained as the most frequently appearing character string with leading three character "COM". "OMPRESS_" that exists in sample data 1 and 2 can also be obtained as the most frequently appearing character string with leading three characters "OMP". Similarly, the most frequently appearing character string with leading three characters, "MPR", . . . and "ARE" can be obtained.

In step S20, the most frequently appearing character strings with each set of leading three characters obtained in step S19 are registered as initial values in descending order of frequency. Specifically, the "frequency" of each set of leading three characters stored in the frequency counter 131 are referenced and the most frequently appearing character strings are registered as initial values in descending order of its value. The registration check unit 133 corresponding to each set of leading three characters of the most frequently appearing character string registered as initial values are set to "TRUE".

Figure 17:
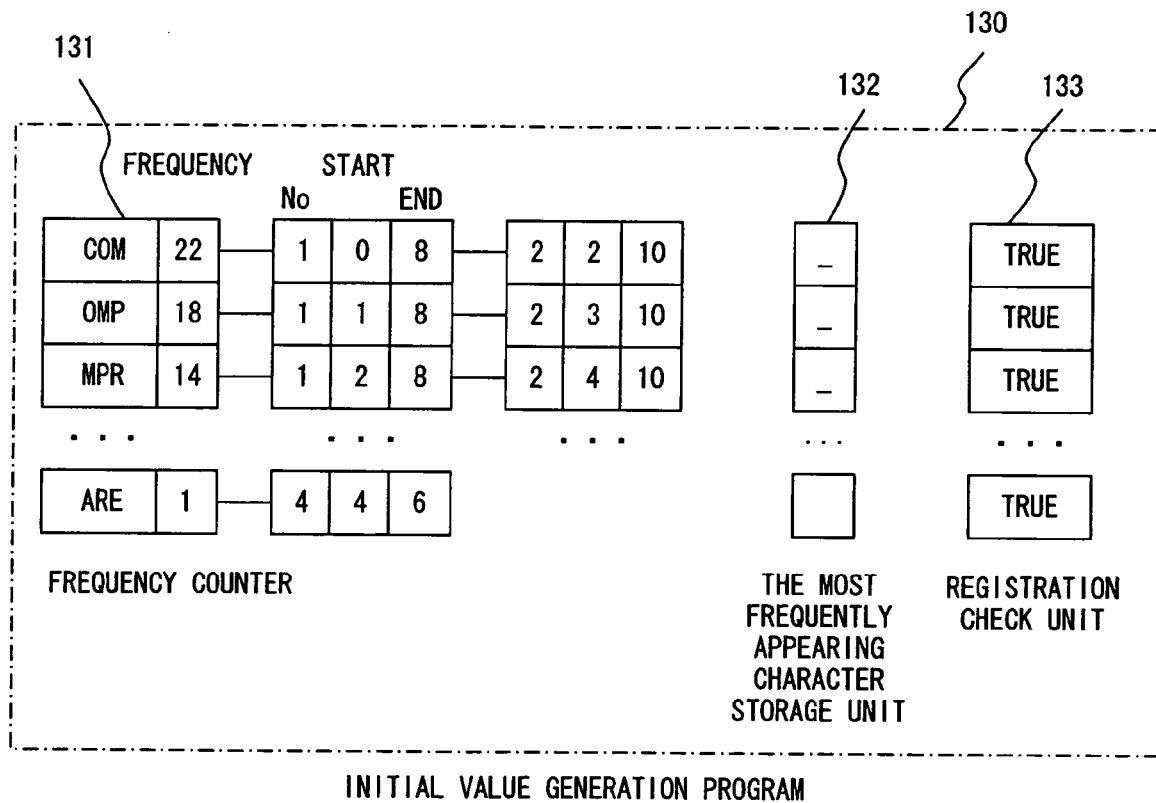
FIG. 17 explains the process of the flowchart shown in FIG. 12 (No.5).

As a result, the contents of the frequency counter 131, most frequently appearing subsequent character storage unit 132 and registration check unit 133 of the initial value generation program 130 become as shown in FIG. 17. As shown in FIG. 17, in the case of the first preferred embodiment, the most frequently appearing character string with all the leading three characters that appear in the sample data 120 are registered as initial values.

The initial values registered in this way are outputted to a compression program 150. The compression program 150 stores the initial values from the initial value generation program 130 as initial values 112, and also generates a hash table 111 based on the initial values 112. [Variations of Initial Value Generation Program]

Figure 18:
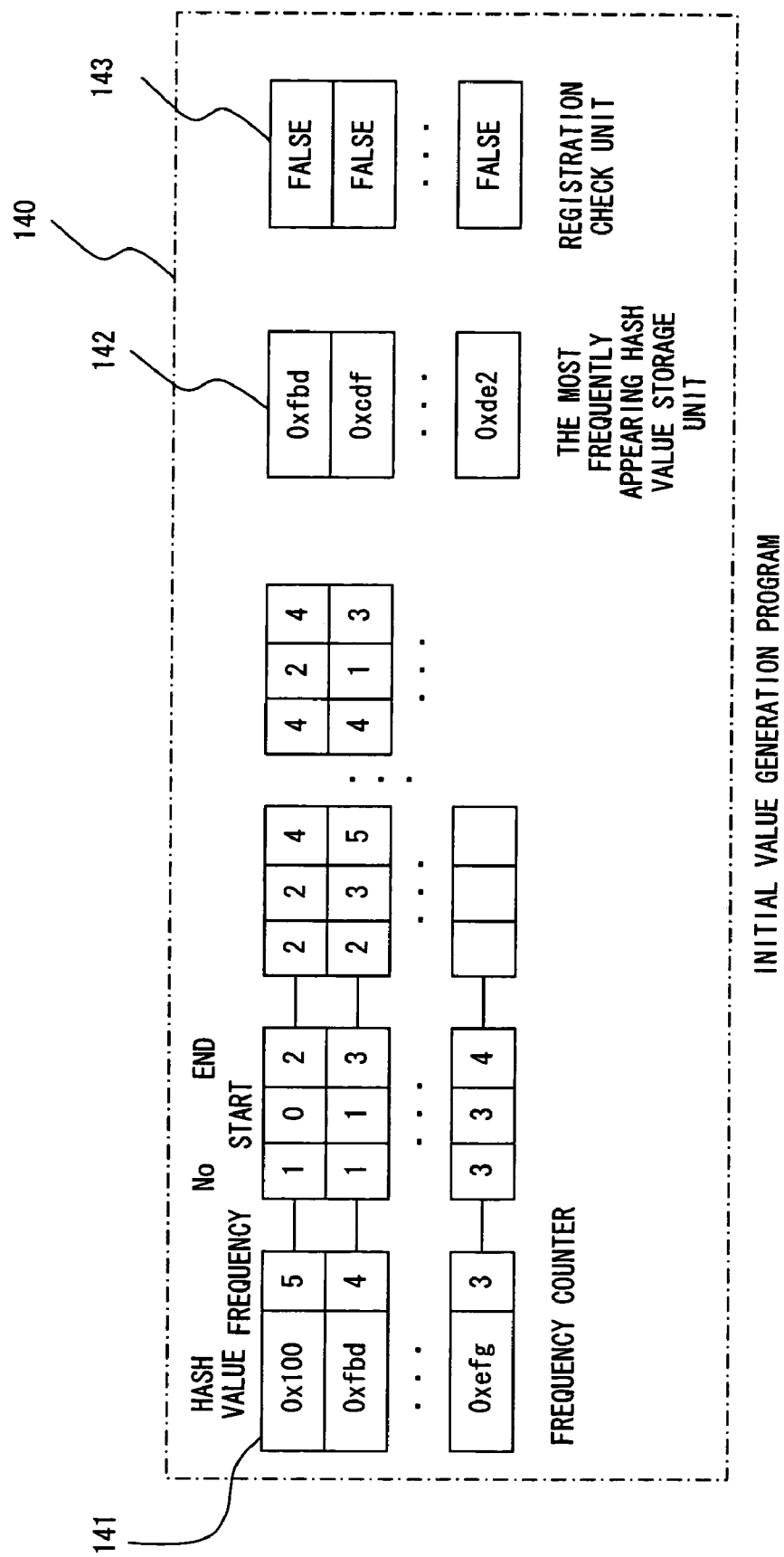
FIG. 18 shows an example of the configuration of a frequency counter for managing leading three characters by a hash value.

FIG. 18 shows an example of the configuration of a variation of the initial value generation program.

The initial value generation program 140 shown in FIG. 18 classifies character strings with the same hash value of leading three characters, based on the principle shown in FIG. 7 and obtains/registers the most frequently appearing character string of each group as an initial value.

The initial value generation program 140 shown in FIG. 18 comprises a frequency counter 141, a most frequently appearing subsequent hash value storage unit 142 and a registration check unit 143.

The frequency counter 141 comprises a component list composed of a "hash value", "frequency" and a set of a "sample data number", a "start position" and an "end position". This list has the same structure as that of the initial value generation program 130.

The most frequently appearing subsequent hash value storage unit 142 has the same function as the most frequently appearing character storage unit 132 of the initial value generation program 130 and stores the hash value of a character subsequent to leading three characters. Finally, the hash value of the last character of the most frequently appearing character string in each hash value group is stored in this most frequently appearing subsequent hash value storage unit 142.

The registration check unit 143 has the similar configuration/function as the registration check unit 133 of the initial value generation program 130.

The process of the initial value generation program 140 registering initial values can be realized by an almost the same algorithm as that of flowchart shown in FIG. 12. Specifically, by modifying the flowchart shown in FIG. 12 in such a way as to process a "hash value" instead of a "character", an initial value registration processing algorithm of the initial value generation program 140 can be realized.

The Second Preferred Embodiment

Figure 19:
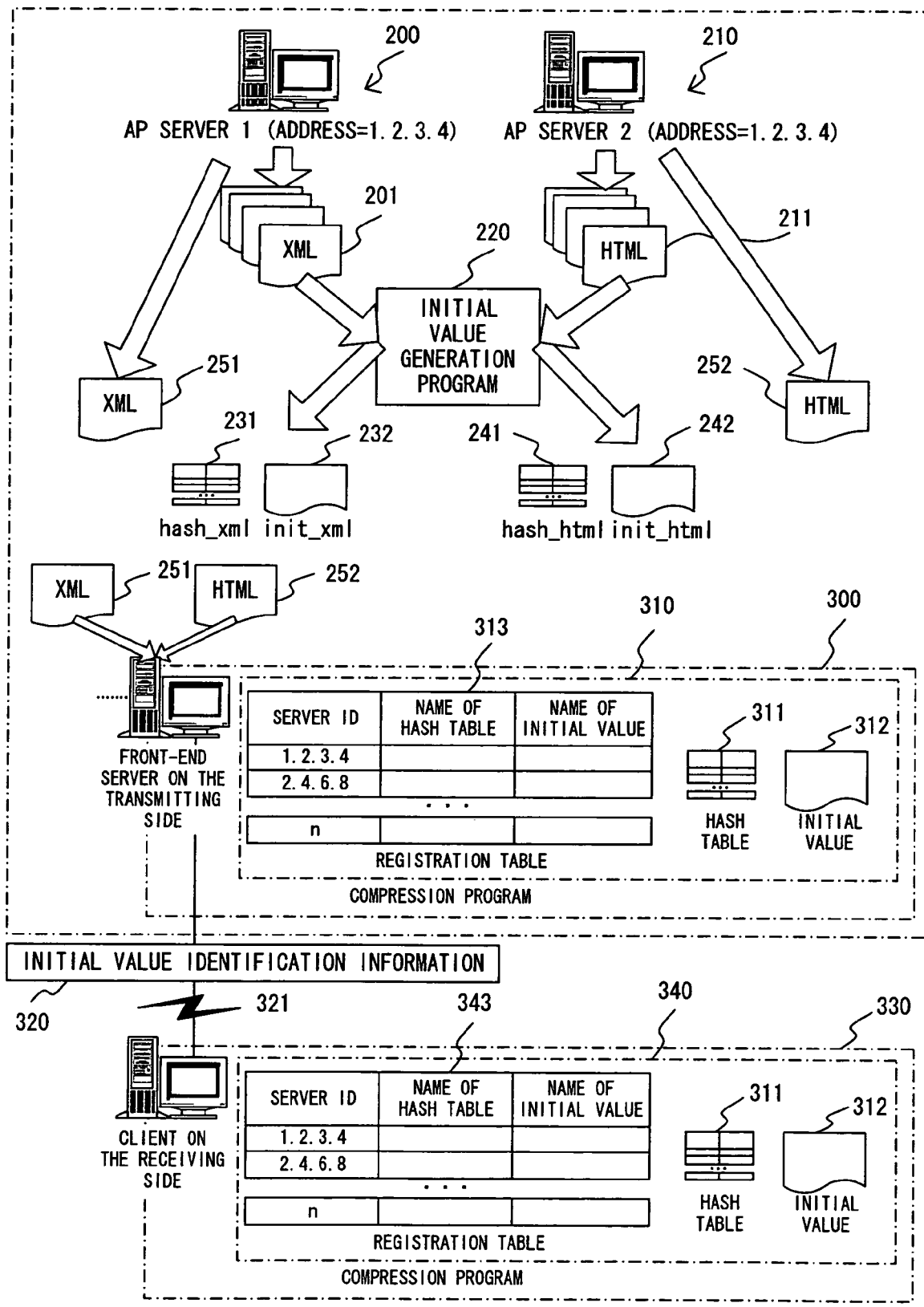
FIG. 19 shows the system configuration of the second preferred embodiment of the present invention.

FIG. 19 shows the system configuration of the second preferred embodiment adopting the data compression method of the present invention.

The computer system shown in FIG. 19 comprises an AP server 200 (AP server 1), an AP server 210 (AP server 2), a front-end server 300 and a client 330. The front-end server 300 and the client 330 are connected by a network 321. This system comprises n AP servers which are server machines for providing application services, such as a WEB service, a mail service and the like. When describing an AP server below, the AP servers 200 and 210 are mainly described.

The AP server 200, AP server 210 and front-wend server 300 are connected by a communication line, such as a local area network (LAN) or the like, and constitute the data center of a service provider or the like. The AP servers 200 and 210 are server machine for performing the process of a service to be provided, and the front-end server 300 is a server machine for mediating communication between the AP servers and the client 330.

Addresses "1. 1. 1. 1." And "1. 2. 3. 4." are assigned to the AP servers 200 and 210, respectively. These addresses are used as the server IDs (server identifiers) of the AP servers 200 and 210 by the front-end server 300 and the client 330. As the server ID, an Internet protocol (IP) address, a uniform resource locator (URL), a domain name are used.

The AP server 200 is an application server for transmitting extensible markup language (XML) data 251 to the client 330 via the front-end server 300. The AP server 210 is an application server for transmitting hyper text markup language (HTML) data 252 to the client 330 via the frond-end server 300.

The AP server 200 executes the initial value generation program 220 in one timing before transmitting XML data 251 to the client 220 and generates a hash table 231 and an initial value (initial value character string) 232, based on XML sample data 201. Then, the AP server 200 transmits the hash table 231 and the initial value 232 to the client 330 via the front-end server 300.

The AP server 210 executes the initial value generation program 220 in one timing before transmitting HTML data 252 to the client 220 and generates a hash table 241 and an initial value (initial value character string) 242, based on HTML sample data 252 via the front-end server 300. And AP server 210 transmits the hash table 242 and the initial value 242 to the client 330 via the front-end server 300.

The initial value generation program 220 is almost the same as the initial value generation program 130 of the first preferred embodiment, is stored in a storage or the like, which is not shown in FIG. 19 and are shared by the AP servers 200 and 210.

The front-end server 300 mediates communication between the client 330 and AP server 200 or 210. The front-end server 300 compresses XML data 251 and HTML data 252 which are received from the AP servers 200 and 210, respectively and transmits the compressed data to the client 330. The front-end server 300 is, for example a Web server, and communicates with the client 330 by a protocol, such as a hyper text transfer protocol (HTTP) or the like.

The front-end server 300 has a compression program 310 and compresses XML data 251 and HTML 252 that are received from the AP servers 200 and 210, respectively, by executing this compression program 310.

The compression program 310 comprises a hash table 311, an initial value (initial value character string) 312 and a management table 313. The hash table 311 and initial value 312 are the hash table 231 and initial value 232 received from the AP server 200 or the hash table 241 and initial value 242 received from the AP server 210. Every time the front-end server 300 receives a hash table and an initial value from the AP servers 200 or 210, it rewrites the hash table 311 and initial value 312 by the received hash table and initial value.

The registration table 313 registers the hash table and the management information of the initial value that are received from the AP server. The registration table 313 is composed of n lines, and three items of a "server ID", a "hash table name" and an "initial value name" in each line. The server ID is the address of an AP server. The hash table name is the name of each hash table. The initial value name is the name of an initial value. The registration table 313 manages hash tables and initial values that are used to compress XML or HTML data received from each AP server by this configuration.

The client 330 can be any computer, such as a portable terminal, a cellular phone, a personal computer, an RF ID tag, car-mounted terminal or the like as long as it is connected and can communicate with the front-end server 300 via a network 321. The client 330 has a compression program 340 and decompresses compressed XML data 251 or HTML data 252 that is received from the front-end server 300, by executing this compression program 340.

The compression program 340 has the same configuration as the compression program 310 of the front-end server 300 as referred to above and comprises a hash table 341, an initial value 342 and a registration table 343.

Since the registration table 343 has the same configuration as the registration table 313 of the front-end server 300, its detailed description is omitted.

When receiving XML data 251 or HTML data 252 from the front-end server 300, the client 330 receives initial value identification information 320 from the front-end server 300.

This initial value identification information 320 is needed to obtain an initial value and a hash table used when decompressing data (XML data 252 or HTML data 252) received from the front-end server 30 by referring to the registration table 343. The initial value identification information 320 is composed of, for example, a server ID, an initial value name or a hash table name, or a combination of them.

Next, the operation of the second preferred embodiment with the above-described configuration.

Figure 20:
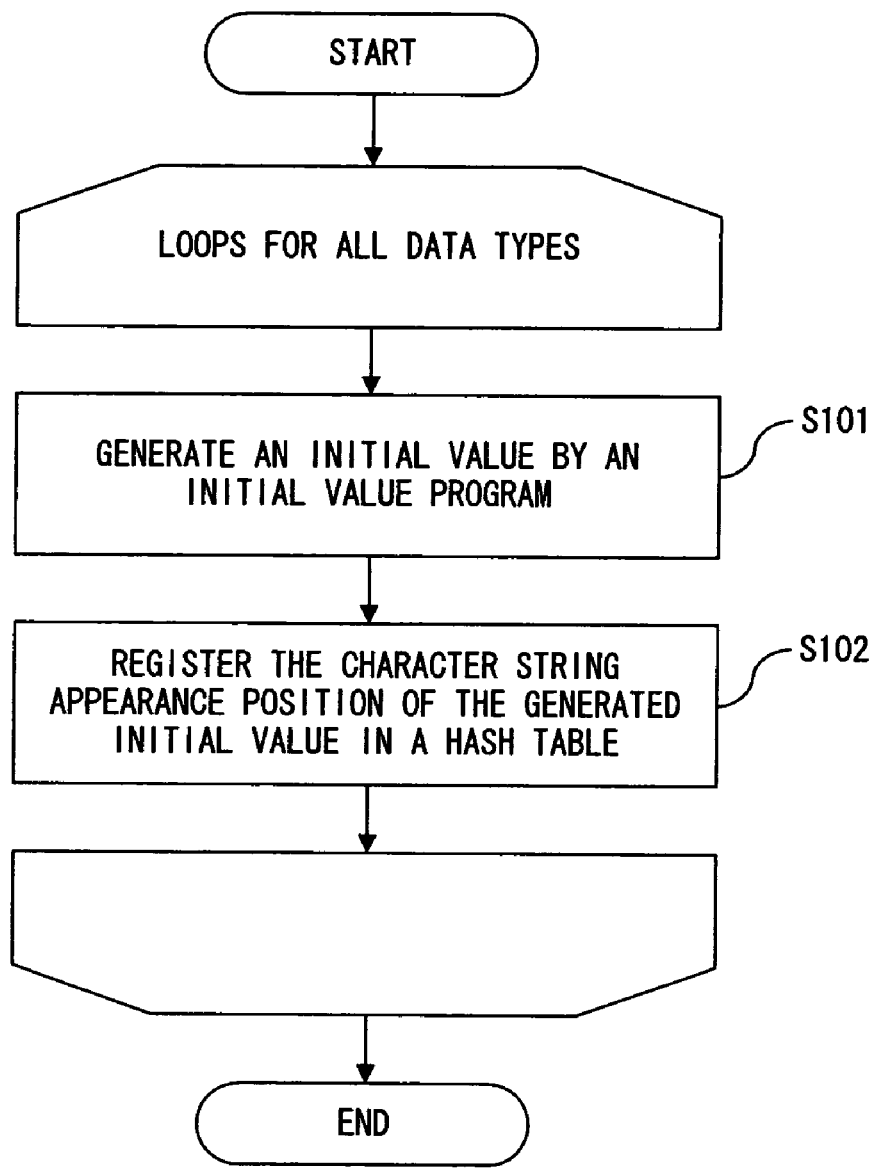
FIG. 20 is a flowchart showing the initial value generation process and hash table generation process of an AP server.

FIG. 20 is a flowchart showing the process of an AP server (AP server 200 or 210) generating an initial value and a hash.

The AP server generates an initial value (initial value 232 or 242), based on XML sample data 201 or HTML sample data 211 (step S101), executing the initial value generation program 220. Then, it registers the hash value of the generated initial vale and its appearance position in a hash table (step S102).

Figure 21:
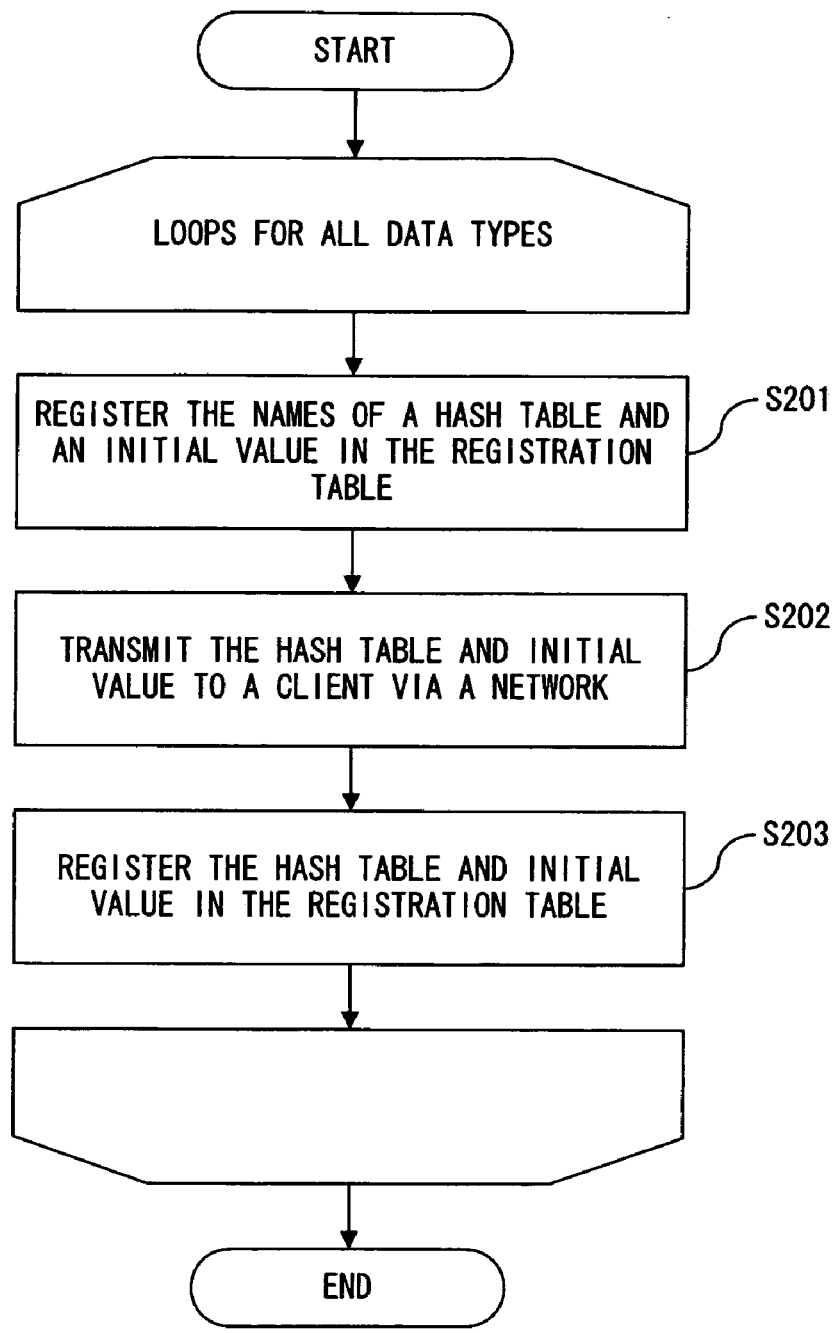
FIG. 21 is a flowchart showing the process of a front-end server.

FIG. 21 is a flowchart showing the registration table process of the front-end server 300.

The front-end server 300 registers the names of the received hash table (hash table name) and initial value (initial value name) in the registration table 313 (step S201).

Next, the front-end server 300 transmits the hash table and the initial value to the client 330 via the network (step S202).

Then, the front-end server 300 registers the hash table and information about the initial value (a server ID, a hash table name and am initial value name) in the registration table 313 (step S203).

Thus, the hash table and initial value that are received from the AP server is transmitted to the client 330 and also the received hash table and information about the initial value are registered in the registration table 313.

Figure 22:
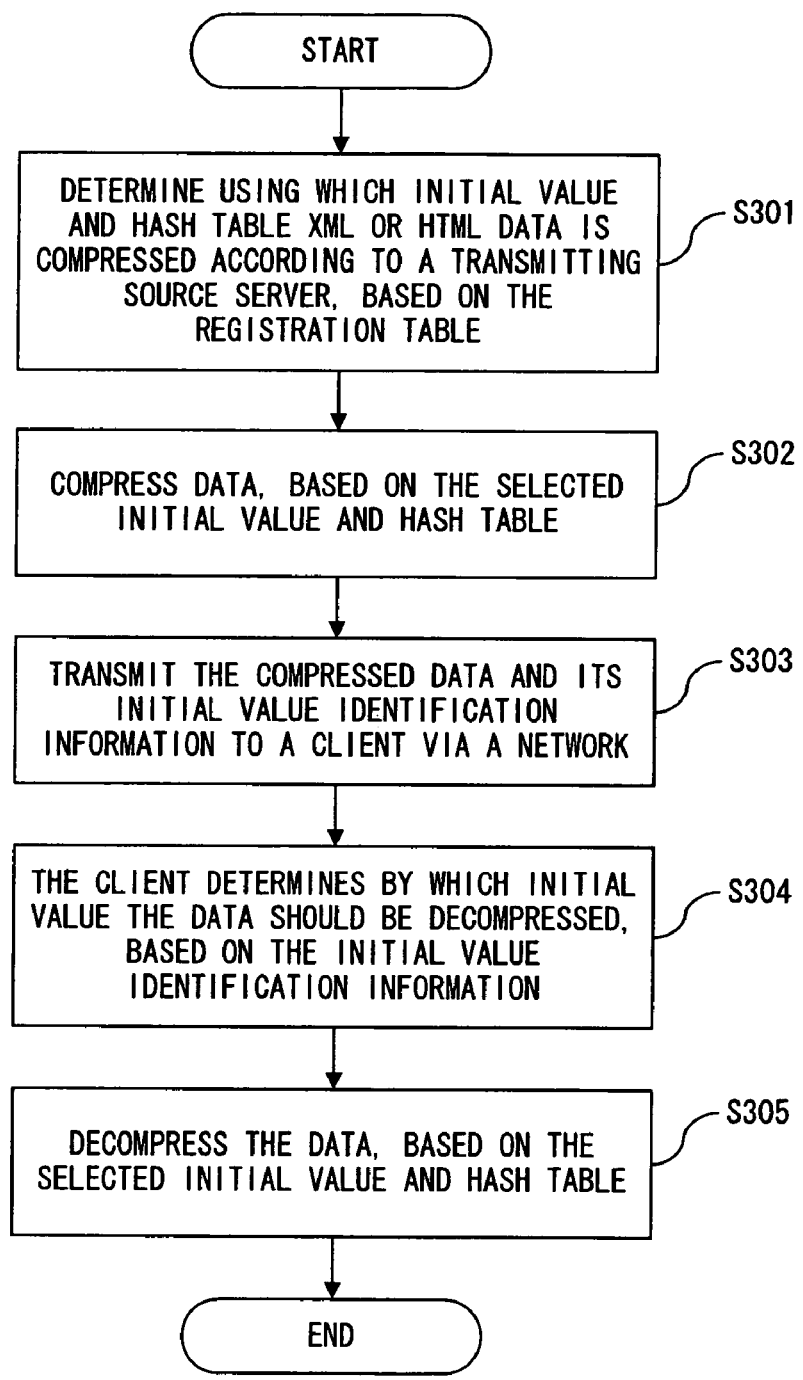
FIG. 22 is a flowchart showing the compressed data decompression process performed between the front-end server and a client.

FIG. 22 is a flowchart showing the data compression/decompression process performed between the front-end server 300 and a client 330.

In the flowchart of FIG. 22, steps S301-S303 and step S304 and S305 are the processes of the front-end server 300 and the client 330, respectively.

The front-end server 300 selects an initial value and a hash table that are to be used to compress data according to the transmitting source AP server of the data (XML or HTML data), based on the server ID of the registration table 313 (step S301).

Then, the data received from the AP server is compressed based on the selected initial value and hash table (step S302).

Then, the compressed data and the initial value identification information 320 corresponding to the initial value used in the data compression are transmitted to the client 330 via the network 321 (step S303).

The client 330 search for data from the registration table 343, based on the initial value identification information 320 received from the front-end server 300 and selects an initial value and a hash table needed to decompress the compressed data received from the front-end server 300 (step S304).

Then, the compressed data is decompressed based on the selected initial value and hash table (step S305).

In this way, in the second preferred embodiment, an initial value and a dictionary (hash table) used to compress/decompress the data to be transmitted to the client 330 of an application (service) to be provided are generated on the AP server side and are transmitted to the front-end server 300. The front-end server 300 manages the initial value and dictionary received from the AP server by the registration table 313 and also transmits them together with its initial value identification information 320 to the client 330 via the network 321.

The client 330 manages the initial value and dictionary that are received from the front-end server 300 by the registration table 343. Then, upon the receipt of the compressed data and its initial value identification information 320 from the front-end server 300, the client 330 obtains an initial value and a hash table that are needed to decompress the compressed data by referring to the registration table 434 based on the initial value identification information 320 and decompresses the compressed data using them.

However, the compressed data can also be decompressed only by an initial value. This is because a dictionary (hash table) can be generated based on the initial value. Therefore, even in a system in which the front-end server 300 and client 330 receive only an initial value from the AP server, data can be compressed/decompressed using the data compression method of the present invention.

In the present invention, a server or a client can also generate and store in advance a plurality of dictionaries (an initial value or an initial value and a hash table), for example, for each service in advance, and a computer (a server or a client) that transmits the data of a service in the first place can also determine which dictionary to use for a series of data groups transmitted/received between the server and the client, of the service, according to the service (application) requested to process by the client or the service that the server are going to provide. Alternatively, a server that receives a request to provide a service from a client can determine a dictionary to be applied to a series of data transmission/reception used to provide the service, transmit information for specifying the data and dictionary of the service or dictionary information when replying to the client, and compress and decompress data in the transmission/reception of the service data, using the determined dictionary.

Furthermore, the plurality of dictionaries possessed by the server or client can also be generated according to each terminal type of the client.

In this case, for example, either the server or the client can attempt to compress data that is actually transmitted/received and is also compressed by the plurality of dictionaries, adopt a dictionary with the highest compression efficiency as a compression dictionary and notify a communication partner of information about the adopted dictionary.

Alternatively, when transmitting data to the server, the client can transmit the data to the server after compressing the data, using a dictionary storing the data.

Although in the above description of the preferred embodiments, text data is compressed as data to be compressed, the application of the present invention is not limited to this. For example, the present invention can also be applied to the compression of a source program, an execution program (binary data) and the like.

According to the present invention, after classifying character strings that appear in sample data into groups of character strings with the same leading n characters, the most frequently appearing character string is detected from each piece of sample data and the detected most frequently appearing character string is selected as an initial value to be registered in a dictionary. Therefore, in a limited initial value size, an initial value with high compression efficiency can be registered. Furthermore, more character strings with long matching length which improve a compression ratio can be registered in a dictionary.

Since after classifying character strings that appear in sample data into groups of character strings with the same hash value of leading n characters, the most frequently appearing character string is detected from groups and the detected most frequently appearing character string is specified as an initial value to be registered in a dictionary.(hash table), an initial value registered in the dictionary can be prevented from being overwritten by another initial value. In this case, more initial values can be efficiently registered in the area with a limited size, of the dictionary.

Furthermore, by using a dictionary in which initial values are registered in advance thus, even fairly small data to be compressed can be efficiently compressed.

By using an appropriate one of a plurality of dictionaries generated thus, transmitting data can be efficiently compressed.

The present invention is suited to compress data which is transmitted/received in a communication system with fairly small capacity of data, such as communication of mobile terminals, communication of radio frequency identification (RFID), communication between vehicles in intelligent transportation system (ITS) and the like.

What is claimed is:

1. A data compression method for generating an initial value from sample data, registering in advance the initial value in a dictionary and encoding data using the dictionary, comprising:

classifying character strings in sample data into groups with a same longest leading n characters (n=natural figure); and detecting a most frequently appearing character string from each of the groups and registering the most frequently appearing character string in the dictionary as an initial value.

2. The data compression method according to claim 1, wherein when detecting the most frequently appearing character string, appearance frequency of each character subsequent to the leading n characters is calculated and the most frequently appearing character string is determined based on the appearance frequencies.

3. The data compression method according to claim 2, wherein a character string in which the sum of appearance frequencies of each character subsequent to the leading n characters is determined to be the most frequently appearing character string.

4. A compression data transmitting method wherein
   a server has dictionary information generated by the data compression method according to claim 1;
   the server transmits the dictionary information to a client; and
   when data is transmitted/received between the server and the client, the data is transmitted/received after compressing the data by the dictionary information.

5. The compression data transmitting method according to claim 4, wherein the server has dictionary information generated by the data compression method for each type of a service to provide and when providing a client with a service, compresses data to be transmitted to the client, using the dictionary information corresponding to the service.

6. The compression data transmitting method according to claim 4, wherein the client has the dictionary information for each type of service to be provided by a server, and compresses the data using the dictionary information corresponding to the service when transmitting data to a server.

7. The compression data transmitting method according to claim 4, wherein the server has a plurality of pieces of dictionary information generated by the data compression method and when transmitting data to the client, compresses the data, using the dictionary information with the highest data compression ratio.

8. The compression data transmitting method according to claim 4, wherein the client has a plurality of pieces of dictionary information generated by the data compression method and when transmitting data to the server, compresses the data, using the dictionary information with the highest data compression ratio.

9. A data compression method for generating an initial value from sample data, registering in advance the initial value in a dictionary and encoding data using the dictionary, comprising:
   classifying character strings in sample data into groups with the same hash value of longest leading n characters (n=natural figure); and
   detecting a most frequently appearing character string from each of the groups and registering the most frequently appearing character string in the dictionary as an initial value.

10. The data compression method according to claim 9, wherein when detecting the most frequently appearing character string, appearance frequency of each character subsequent to the leading n characters is calculated and the most frequently appearing character string is determined based on the appearance frequencies.

11. The data compression method according to claim 10, wherein a character string in which the sum of appearance frequencies of each character subsequent to the leading n characters is determined to be the most frequently appearing character string.

12. A compression data transmitting method wherein
   a server has dictionary information generated by the data compression method according to claim 9;
   the server transmits the dictionary information to a client; and
   when data is transmitted/received between the server and the client, the data is transmitted/received after compressing the data by the dictionary information.

13. The compression data transmitting method according to claim 12, wherein the server has the dictionary information for each type of service to be provided, and compresses data to be transmitted to the client, using the dictionary information corresponding to the service when providing a client with a service.

14. The compression data transmitting method according to claim 12, wherein the client has dictionary information generated by the data compression method for each type of a service to provided by a server and when transmitting data to the server, compresses the data, using the dictionary information corresponding to the service.

15. The compression data transmitting method according to claim 12, wherein the server has a plurality of pieces of dictionary information generated by the data compression method and when transmitting data to the client, compresses the data, using the dictionary information with the highest data compression ratio.

16. The compression data transmitting method according to claim 12, wherein the client has a plurality of pieces of dictionary information generated by the data compression method and when transmitting data to the server, compresses the data, using the dictionary information with the highest data compression ratio.

17. A storage medium, which is readable by a computer to generate an initial value from sample data, to register the initial value in a dictionary in advance and to encode data using the dictionary, the process comprising:
   classifying character strings in sample data into groups with a same longest leading n characters (n=natural figure); and
   detecting the most frequently appearing character string from each of the groups and registering the most frequently appearing character string in the dictionary as an initial value.

18. A data compression method for generating an initial value from sample data, registering in advance the initial value in a dictionary and encoding data using the dictionary, comprising:
   classifying character strings in sample data into groups with a same longest leading n characters (n=natural figure); and
   detecting a most frequently appearing character string from each of the groups and registering the most frequently appearing character string in the dictionary as an initial value where the initial value provides a high compression efficiency responsive to the long character string that frequently appears in data allowing data to be compressed and decompressed using the initial value when the initial value appears in a character string to be compressed.

19. A data compression method for generating an initial value from sample data, registering in advance the initial value in a dictionary and encoding data using the dictionary, comprising:
   classifying character strings in the sample data responsive to longest number of leading characters; and
   detecting, in the sample data, a most frequently appearing character string of the strings with the longest number of leading characters; and
   registering the most frequently appearing character string in the dictionary as an initial value.

* * * * *